United States Patent [19]
Jørgensen

[11] Patent Number: 5,889,443
[45] Date of Patent: Mar. 30, 1999

[54] FREQUENCY SYNTHESIZING CIRCUIT USING A PHASE-LOCKED LOOP

[75] Inventor: Klaus Jørgensen, Lyngby, Denmark

[73] Assignee: Nokia Mobile Phones, Ltd, Espoo, Finland

[21] Appl. No.: 926,756

[22] Filed: Sep. 10, 1997

[30] Foreign Application Priority Data

Sep. 12, 1996 [GB] United Kingdom .................. 9619028

[51] Int. Cl.⁶ ............................ H03C 3/00; H04L 27/12
[52] U.S. Cl. ........................ 332/100; 332/101; 375/296; 375/303; 375/306
[58] Field of Search ................................ 332/100–103, 332/127; 375/296, 300–307; 331/23

[56] References Cited

U.S. PATENT DOCUMENTS

| | | | |
|---|---|---|---|
| 4,937,537 | 6/1990 | Nyqvist | 331/17 |
| 5,079,520 | 1/1992 | Rapeli | 331/100 |
| 5,153,468 | 10/1992 | Jokinen et al. | 307/520 |
| 5,175,510 | 12/1992 | Satomaki | 331/17 |
| 5,311,152 | 5/1994 | Lautzenhiser | 332/127 |
| 5,315,183 | 5/1994 | Ruotsalainen | 307/511 |
| 5,317,283 | 5/1994 | Korhonen | 331/1 A |
| 5,325,075 | 6/1994 | Rapeli | 332/103 |

FOREIGN PATENT DOCUMENTS

| | | |
|---|---|---|
| 0209754 A2 | 1/1987 | European Pat. Off. . |
| 0408238 A2 | 1/1991 | European Pat. Off. . |
| 2046541 | 11/1980 | United Kingdom . |
| 2233844 | 1/1991 | United Kingdom . |

*Primary Examiner*—David Mis
*Attorney, Agent, or Firm*—Perman & Green, LLP

[57] ABSTRACT

A frequency synthesizing circuit has an input on which a bit flow is received, and an output on which a data-modulated output signal is supplied. The circuit moreover comprises a crystal oscillator supplying a reference clock signal, a phase-locked loop (PLL) having a VCO and a phase detector. The phase detector compares the data-modulated output signal with the reference clock signal and, in response to this, supplies an error signal by means of which the VCO output frequency is controlled. A compensation circuit, which receives a measure of the bit flow received, compensates the data-modulated output signal in the phase-locked loop in response to this before it is supplied to the phase detector.

15 Claims, 4 Drawing Sheets

FREQUENCY SYNTHESIZING CIRCUIT USING A PHASE-LOCKED LOOP

BACKGROUND OF THE INVENTION

The invention concerns a method of frequency synthesis by means of a phase-locked loop, wherein a data-modulated output signal is generated by a voltage controlled oscillator (VCO) in the phase-locked loop in response to a modulating bit flow received on an input of the oscillator. Finally, the invention concerns a frequency synthesizing circuit as well as a radio telephone having such a circuit.

When data modulating the VCO in a PLL are constant (zeros or ones) for a period of some length or possess a majority of either zeros or ones, the output frequency of the VCO differs from the nominal centre frequency in this period owing to the modulation with data. The PLL therefore reacts by trying to bring the frequency back to the nominal centre frequency. This is a problem in particular in connection with telephones which are associated with digital cordless systems in which the VCO is modulated directly with data.

To obtain rapid locking, the loop must have a high loop bandwidth (about 20 kHz), while a low loop bandwidth (about 2 kHz) is required to prevent the modulation frequency from affecting the PLL. If the modulation in a data packet does not vary or possess a majority of either zeros or ones, the modulation frequency will be within the loop bandwidth.

SUMMARY OF THE INVENTION

According to the invention there is provided a frequency synthesizing circuit having an input on which a bit flow is received, and an output on which a data-modulated output signal is supplied; said synthesizing circuit comprising a stable clock signal generator supplying a stable clock signal, a phase-locked loop (PLL) comprising a voltage controlled oscillator (VCO) for generating the output signal in response to the data bit flow received on the input, and a phase detecting unit for comparing a signal representing the output signal supplied by the voltage controlled oscillator with a signal representing the clock signal supplied by the stable clock signal generator, and for generating a phase error signal in dependence hereto, said voltage controlled oscillator is furthermore controlled by the phase error signal generated by the phase detecting unit by, said synthesizing circuit furthermore comprising a circuit for monitoring the distribution of bits in the bit flow received on the input and for generating an signal representing the distribution in dependence hereof, and a N/(N+1) divider circuit in the phase-locked loop for dividing the frequency of the output signal said synthesizing circuit receives a pulse width modulated control signal from a central control unit for controlling the overall divisor by controlling the relation between the number of period having the divisor N and (N+1), respectively, and said divider circuit is associated with a compensation circuit for generating further pulse width modulated control signals having pulse widths corresponding to a slight increase and decrease of the overall divisor defined by pulse width modulated control signal from the central control unit, and including means for selecting one of the three pulse width modulated control signals in dependence of the error signal from the monitoring circuit.

Hereby a simple solution is provided for compensating the divisor in the divider circuit in dependence of the data to be modulated. The carrier frequency of the modulated output signal is hereby kept stable, even in case of long sequences in the data bit flow where the data possess a majority of either zeroes or ones.

Preferably, the said compensation circuit comprises two branches carrying the pulse width modulated control signal from the central control unit. A delay provided in one of said branches for providing a delayed version of the pulse width modulated control signal. Two logic gates (an AND and an OR gate) receives the delayed and the non-delayed version of the pulse width modulated control signal and provides a pulse width modulated control signal with reduced/increased duty cycle compared with the pulse width modulated control signal from the central control unit. Hereby is just a question in selecting the right PWM control signal for obtaining the desired overall divisor.

By using a flip-flop as delay in the input of compensation circuit the all three PWM control signals will become synchronous. By using a flip-flop as delay in the output of compensation circuit the used PWM control signal will maintain the synchronization with the PWM control signal from the central control unit.

An up/down counter, together with the necessary logic's such as the used flip-flops, is easy to handle in a digital ASIC. The variable divider, which provides the compensation, may advantageously be a digital fraction N divider. In addition to the divisor-controlling compensation signal, the compensation circuit may advantageously generate a second compensation signal which superimposes the error signal from the phase comparator, and which compensates for any residual phase error. The divider divides with an integer, and there will therefore be a residual error after the division, and although this residual error is quite small, it may in some cases, e.g. in connection with wireless data transmission, be expedient to remove the residual error (quantization noise from the division).

Preferably, the monitoring circuit includes two groups of flip-flops, the first group of flip-flops receives data bit flow a signal indicating counter overflow or underflow as input, and the second group of flip-flops outputs the selection signal selecting one of the three pulse width modulated control signals; and said first and the second group of flip-flops in relation to the pulse width modulated control signal from the central control unit operates asynchronously and synchronously, respectively. Hereby the compensation part of the synchronizer will become synchronized with the pulse width modulated control signal from a central control unit for controlling the overall divisor.

The fraction N divider may advantageously be designed with a prescaler which initially divides the signal frequency by a factor 64/65 and a divider with a fixed frequency division of 17. Frequency division can hereby be obtained in the range 1088 (17×64) to 1105 (17×65). 18 divisors are thus accessible corresponding to 18 possible DECT channels. The prescaler is controlled by a modulus control signal from a central control unit in response to which channel the telephone transmits on.

Finally, the invention concerns a radio telephone for use in e.g. a digital cordless system, such as DECT or another system in which bit trains may occur, and in which data possess a majority of either zeros of ones, and comprising a frequency synthesizing circuit as described.

The invention will be described more fully below in connection with preferred embodiments and with reference to the drawing, in which

DETAILED DESCRIPTION OF PREFERRED EMBODIMENT

The invention will be explained below in connection with a DECT telephone system, which is a standardized, European cordless telephone system based on digital transmission of data in time slots. The data transmission takes place in DECT in one among a plurality of channels having nominal carrier frequencies of the order of 1880–1900 MHz. The frequency fluctuation about the center frequency is of the order of ±288 kHz depending on modulation data. However, the invention may be applied in other connections where the center frequency of a modulated data signal appears to drift, but where the drift is caused by the nature of the data.

Figure 1:
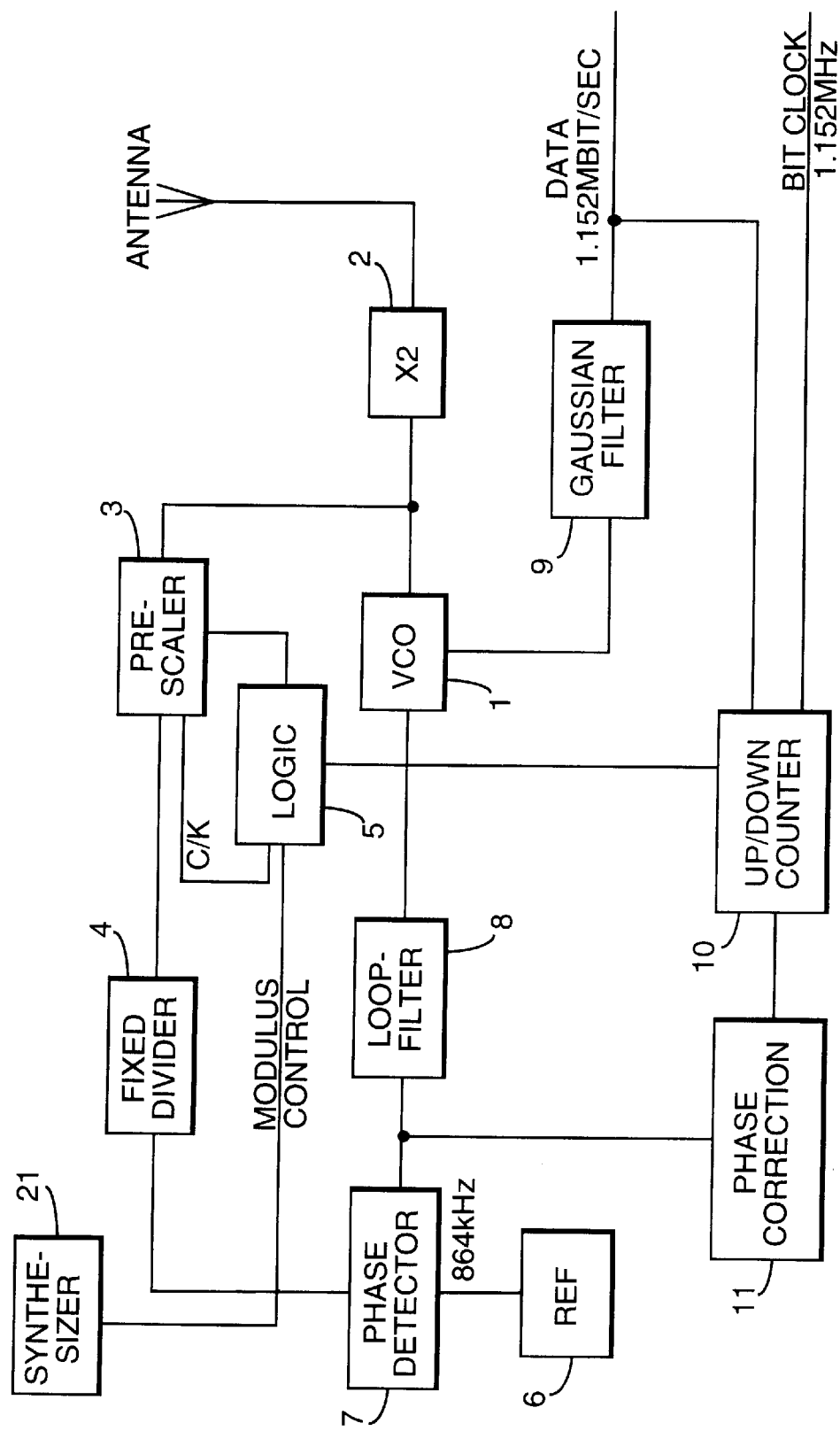
FIG. 1 schematically shows a preferred embodiment of a frequency synthesizing circuit of the invention.

FIG. 1 shows a preferred embodiment of a frequency synthesizing circuit of the invention, and it will be seen that the circuit comprises a phase-locked loop (PLL) having a voltage controlled oscillator 1 which supplies a modulated signal at about 940–950 MHz with a frequency fluctuation of ±144 kHz. The output signal of the VCO is brought up to the desired channel frequency via frequency doubler 2. As will be known to a person skilled in the art, this signal is supplied to an output amplifier (PA stage), which applies to the amplified signal via a switch to the antenna of the telephone. These parts of the telephone are not necessary to the understanding of the invention and are therefore not shown, as they are presumed to be known to a person skilled in the art.

In the preferred embodiment of the invention, the output signal from the VCO is passed to a frequency divider (fractional N divider) which divides the frequency of the modulated data signal from the VCO by a factor N, which is within the range 1089–1098 in the present case, depending on the channel on which the VCO is locked. In the preferred embodiment, the frequency divider comprises a prescaler 3 which divides the VCO signal by a factor which may be selected to be 64 or 65, and a divider 4 which divides the already divided VCO signal by a further factor 17. The actual division is controlled by a synthesizer (not shown) and an integrator 10 via a logic unit 5. The divided signal is passed in the phase-locked loop from the digital frequency divider to a phase detector 7, where it is compared with a stable pulse clock signal from a clock generator 6, which supplies a reference signal of stable frequency, which has a pulse frequency of 864 kHz in the preferred embodiment.

The error signal from the phase detector 7 is passed via a filter 8 to the VCO 1, whereby this is compensated for any frequency drift. The filter 8 ensures that the loop has a loop bandwidth of about 20 kHz to obtain rapid locking.

In the described application, data for transmission have a bit rate of 1.152 Mbits/s, and data are passed via a Gaussian filter 9 (bandwidth×time=0.5) to the VCO as the modulating bit flow. Data are moreover passed to an integrator which, in the preferred embodiment, is formed by an up/down counter 10, where data are clocked into the counter 10 under control of a bit clock having a clock frequency at 1.152 MHz. The counter status is counted one up in the counter if data represent a logic one, and one down if data represent a logic zero. The counter 10, which is a four bit counter, is reset to a value 7 at the start of a transmission, and it wraps around in case of overflow or underflow, which is simultaneously indicated on a TC output, see FIG. 2. The counter 10 thus gives an indication of the distribution between ones and zeros since the last reset of the counter 10. This indication is transferred together with data to the logic unit 5 to control the frequency division. Further, the four bits (Q0–Q3) are transferred from the counter 10 to a phase correction circuit which converts the four bit value to a compensation current which is the error signal from the phase detector 7.

Figure 4:
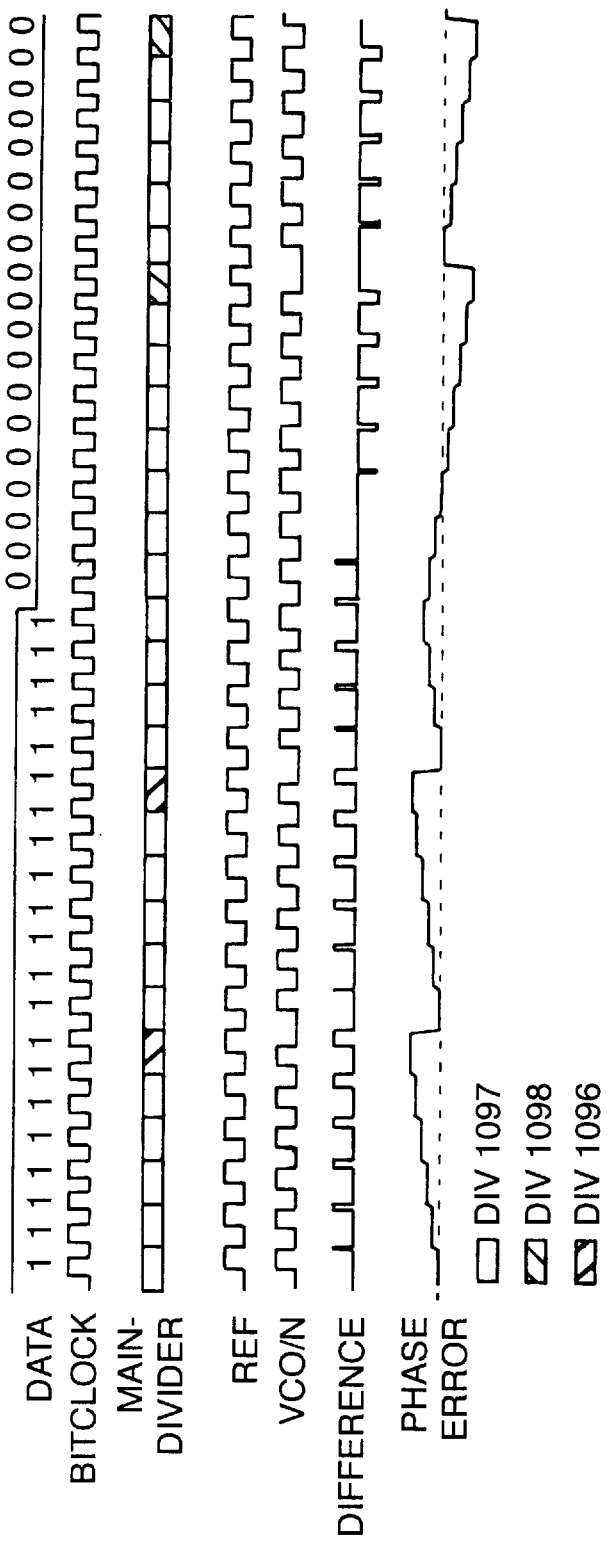
FIG. 4 shows a timing diagram of the circuit shown in FIG. 1 and 2.

When a constant signal level is applied to the phase-locked loop according to the invention, as shown in FIG. 4, the frequency fluctuation caused by the modulation will constantly be 144 kHz, so that the VCO frequency will seem to have changed from the nominal frequency of 940.896 MHz to 941.040 MHz in case of bit trains consisting of ones (or 940.752 MHz in case of bit trains consisting of zeros).

Figure 3:
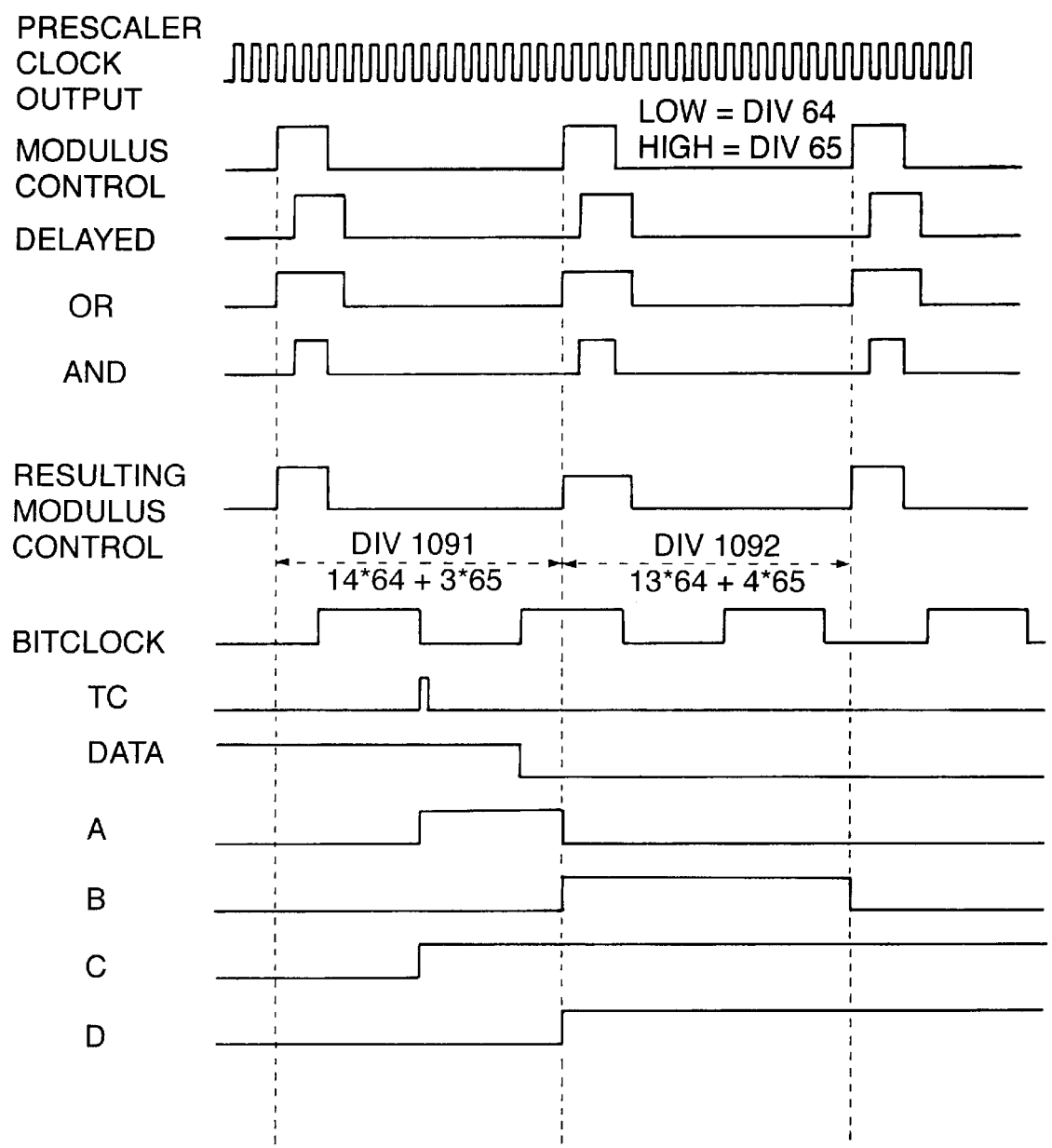
FIG. 3 illustrates the course of the division in the phase-locked loop in the frequency synthesizing circuit of the invention.

When the prescaler 3 receives the output signal from the VCO 1, it generates a prescaler clock output signal which is shown at the top of FIG. 3. The divisor of the prescaler 3 is constant within the individual periods, but may vary from period to period. A synthesizer 21 supplies a modulus control signal (Pulse Width Modulated control signal, PWM) which is shown in the second row in FIG. 3. It will be seen that this modulus control signal is periodic with a cycle corresponding seventeen clock periods in the prescaler clock output signal. The VCO 1 operates at 942.624 MHz, and the divisor must therefore have the value 1091 for the divided signal to correspond to the reference clock signal of 864 kHz. The synthesizer obtains this divisor by means of the modulus control signal, as, within a period of the modulus control signal, the prescaler 3 divides the VCO signal by 64 in fourteen prescaler clock periods and by 65 in three prescaler clock periods. The integrator generates a modify signal in response to the modulating data, and this modify signal is combined with the modulus control signal from the synthesizer in the logic unit 5 to provide a resulting modulus control signal which controls the resulting divisor in the fractional N divider. The resulting modulus control signal is shown in the sixth row in FIG. 3.

FIG. 4 at the top shows an example of arriving data with a bit train consisting of long-cycle sequences first dominated by ones, then by zeros. The bit clock is shown beneath. The reference signal from the reference clock generator 6 is shown as the fourth signal in the diagram. The divisor in the variable divider is shown in the third row. It will be seen that the divisor mostly assumes the value 1097, but drops to 1096 in some periods when data assumes the value "1" for a longer period of time, and increases to 1098 in some periods when data assume the value "0" for a longer period of time. The divided VCO signal is shown in the fifth row. The difference between the reference signal and the divided VCO signal corresponding to the output from the phase detector 7 is shown in the sixth row. The compensation signal from the phase correction unit 11 corresponds to the accumulated phase error and is shown in the bottom row.

It should be mentioned that FIG. 4 illustrates the principles applied, but is drawn incorrectly to facilitate the understanding. During a time slot of 400 data bits at a data rate of 1.152 MHz, which corresponds to 300 reference cycles of the frequency 864 kHz, the phase shift between the data modulated signal and the reference signal will maximally generate a phase error of ±18° depending on whether data exclusively consist of zeros or ones. When using modification of the divisor, the maximum error on the phase detector output will be considerably smaller, since the correction is performed for every sixth reference cycle.

When the divisor in the divider is allowed to vary from 1089 to 1098 in response to the selected DECT channel, the output signal from the VCO may be divided so that the nominal frequency corresponds to the reference frequency. In addition, a suitable logic control of the divisor will ensure compensation for systematic frequency drift caused by the circumstance that zeros and ones do not have the same frequent occurrence among data.

Figure 2:
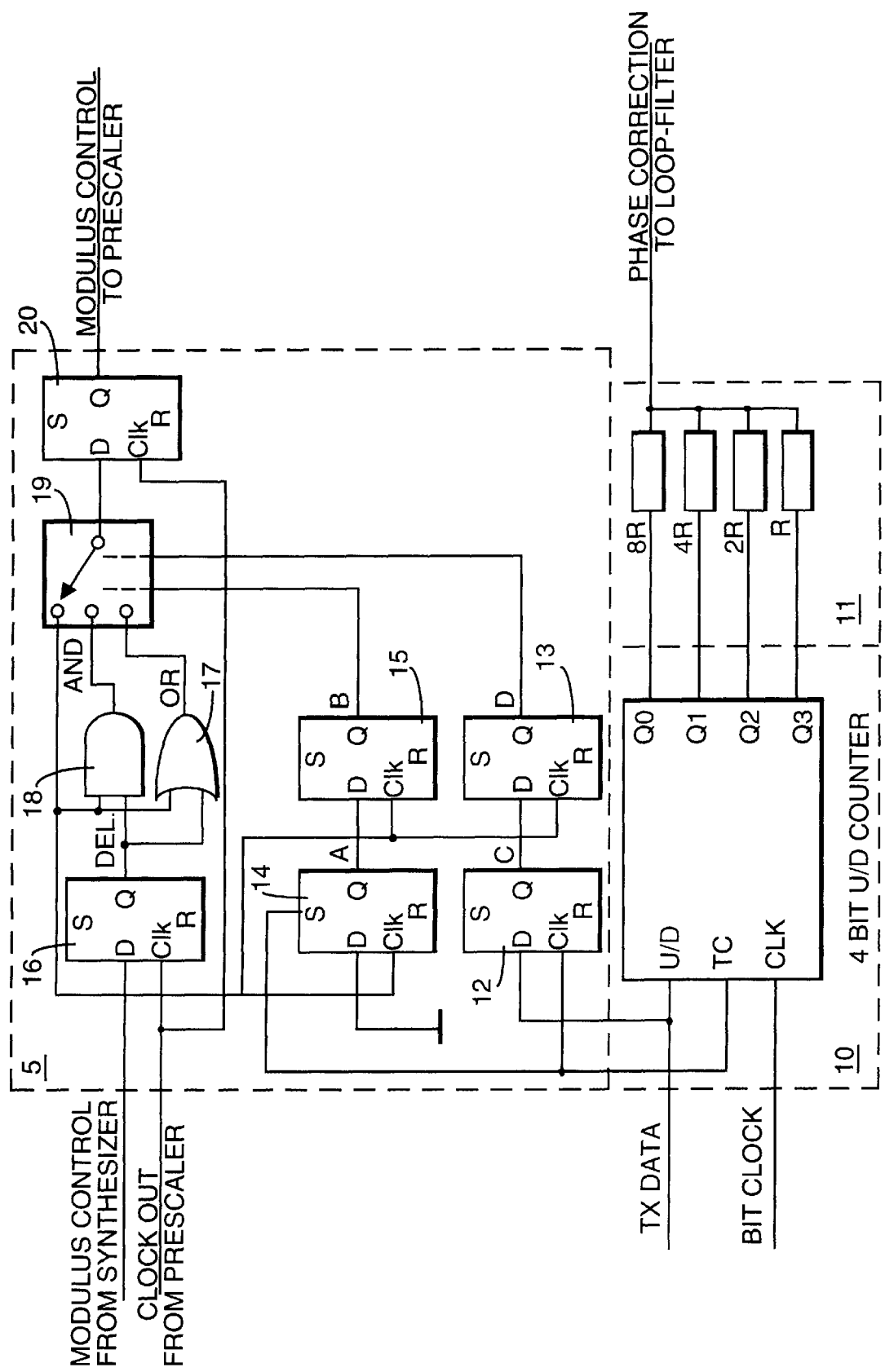
FIG. 2 schematically shows a preferred embodiment of the compensating circuit used in connection with a frequency synthesizing circuit of the invention.

FIG. 2 shows the principle used in connection with compensation for an uneven distribution of zeros and ones in data for transmission. These data bits having a bit rate of 1,152 Mbits/s are passed to the integrator or up/down counter 10, where a U/D input is received. At the same time, the 4-bit counter 10 receives a bit clock signal having a frequency of 1,152 MHz by means of which data are input to the counter 10, whose counter status is incremented or decremented depending on whether the received data bit was one or zero.

The status of the counter is output as a four-bit digital value Q0–Q3 which is converted to a phase correction current in a phase correction circuit 11 having four resistors having the resistance's R, 2R, 4R and 8R; the phase correction flow weights the digital values so that the most significant bit has the greatest weight in the phase correction current. The phase correction current is supplied to the loop filter in which the flow is added with the error current from the phase detector 7, thereby completely eliminating the phase error that might be left after the correction with the variable divisor.

FIGS. 2 and 3 show how the modulus control signal of the synthesizer 21 is modified. The modulating data and a data clock signal are supplied to the 4 bit U/D counter 10, which supplies a TC signal indicating counter overflow or underflow, to the logic unit 5. The logic unit 5 comprises four D flip-flops 12–15.

The first flip-flop 12 receives the modulating data on its D input and the TC signal as a clock. The signal (the modulating data signal) on the D input is transferred to the output (C) at the occurrence of a clock pulse and is held until the next clock pulse.

The second flip-flop 13 receives the output signal (C) from the flip-flop 12 in its D input and the synthesizer modulus clock signal as the clock. The signal on the D input is transferred to the output (D) at the occurrence of a clock pulse and is held until the next clock pulse.

The third flip-flop 14 is connected to ground (zero) with its D input and receives the modulus control signal as the clock. Finally, it receives the TC signal as a set signal, which means that the flip-flop 14 will supply a signal on its output corresponding to logic "1", when it receives a TC pulse and hold this high value on its output (A) until the next clock pulse is received. Otherwise, the value corresponding to logic "0" will be held. The fourth flip-flop 15 receives the output signal (A) from the flip-flop 14 on its D input and the synthesizer modulus control signal as the clock. The signal on the D input is transferred to the output (D) at the occurrence of a clock pulse and is held until the next clock pulse.

The two flip-flops 12 and 14 operate asynchronously in relation to the modulus control signal, while the two other flip-flips 13 and 15 synchronize data from the flip-flops with the modulus control signal. The output signals from the two last mentioned flip-flops 13, 15 serve as control signals to a switch 19 which modifies the synthesizer modulus control signal in response to the control signals. The output signal (B) from the flip-flop 15 indicates whether the counter 10 gives overflow/underflow or not. The output signal (D) from the flip-flop 13 indicates whether overflow or underflow is involved.

The synthesizer modulus signal is supplied together with the clock output signal of the prescaler 3 to the logic unit 5 as input signals. The logic unit produces a delayed version of the synthesizer modulus control signal by means of a flip-flop 16, as the D input receives the modulus control signal with the clock output signal from the prescaler as the clock signal. Thus, a copy of the modulus control signal delayed by precisely one clock period is supplied on the output of the flip-flop 16. This delayed version of the modulus control signal is passed to an AND gate 18 and an OR gate 17 together with the non-delayed version. The modulus control signal is shown together with the delayed version and the output signals from the AND gate and the OR gate 17 in FIG. 3. The use of AND or OR gates allows the duration of the modulus control signals to be increased or decreased by precisely one clock period, as required.

As long as there is an even distribution of zeros and ones among data, no TC signal will occur, and the output value of the (D) flip-flop 15 will therefore assume a value corresponding to logic "0". This means that the switch 19 couples the synthesizer modulus control signal through to the prescaler 3 without modifications, irrespective of the output value (B) of the flip-flip 13. In case of overflow or underflow, a TC pulse will be formed, whereby the output value (D) of the flip-flop 15 changes to a value corresponding to logic "1". This means that the switch 19 is to change position so that the synthesizer modulus control signal is modified before it is transmitted to the prescaler 3. After the occurrence of the TC pulse, a value is formed on the output (B) of the flip-flop 13 depending on whether overflow or underflow was involved. Thus, it is the value on the output (B) which determines whether the divisor is be increased or decreased.

What is claimed is:

1. A frequency synthesizing circuit with a circuit input receiving a data bit flow and circuit output supplying a data modulated output signal and including a phase locked loop (PLL) having a forward path coupled to said circuit output and a feedback path coupled to said forward path, wherein:

said phase locked loop (PLL) comprises:

a voltage controlled oscillator in said forward path, having a first input on which a digital modulating signal is received, a second input from said feedback path on which a phase error signal is received, and an output to said forward path, for supplying said data modulated output signal to said circuit output and said feedback path, said data modulated output signal having a channel frequency determined by said digital modulating signal adjusted by said phase error signal; and prescaler divider means in said feedback path, having a prescaler period, for dividing the channel frequency of the data modulated output signal with a divisor and outputting a divided signal;

and further comprising means for compensating for the distribution of bits in said digital modulating signal comprising:

a stable clock signal generator for supplying a stable clock signal;

a phase detecting unit for comparing said divided signal divided by said prescaler divider means with said stable clock signal, and generating a phase error signal in response thereto;

a monitoring circuit for generating a compensation signal in dependence upon the distribution of bits in said digital modulating signal;

a control unit for outputting a first pulse width modulated control signal; and a compensation circuit, having controlling means, responsive to said first pulse width modulated control signal, for controlling said divisor by controlling the ratio between the number of prescaler periods having the divisor N and the number having the divisor (N+1), and respectively generating second and third pulse width modulated control signals having pulse widths corresponding to a slight decrease and slight increase of said divisor, and, selecting means for selecting and outputting, in response to said compensation signal, one of said first, second, and third pulse width modulated control signals to said prescaler divider means, whereby said divisor is controlled by said control unit in dependence upon said channel frequency and said monitoring unit to compensate for the distribution of bits in said digital modulating signal.

2. A frequency synthesizing circuit according to claim 1, wherein said controlling means of said compensation circuit comprises:

two branches carrying the first pulse width modulated control signal from the control unit;

delay means in one of said branches for providing a delayed version of the first pulse width modulated control signal;

an AND gate receiving the delayed and the non-delayed version of the first pulse width modulated control signal and providing said second pulse width modulated control signal with a reduced duty cycle compared with the first pulse width modulated control signal; and an OR gate receiving the delayed and the non-delayed version of the first pulse width modulated control signal and providing said third pulse width modulated control signal with an increased duty cycle compared with the first pulse width modulated control signal.

3. A frequency synthesizing circuit according to in claim 2, wherein the delay means comprises a flip-flop controlled by a clock signal from said control unit and associated with the first pulse width modulated control signal.

4. A frequency synthesizing circuit according to in claim 1, wherein the selecting means of said compensation circuit comprises a switch receiving the three pulse width modulated control signals, said switch comprising a control input for receiving said phase error signal and selecting one of said pulse width modulated control signals for passing through the compensation circuit.

5. A frequency synthesizing circuit according to in claim 4, wherein the compensation circuit comprises a second flip-flop controlled by a clock signal from said control unit and associated with the first pulse width modulated control signal.

6. A frequency synthesizing circuit according to in claim 1, wherein the monitoring circuit includes an up/down counter for receiving the data bit flow and producing a digital output, said counter increasing or decreasing the digital output in dependence on the data bit flow input thereto, and a D/A converter for receiving said digital counter output and providing a quantization error signal to the phase locked loop wherein said quantization error signal is added to the phase error signal from the phase detecting unit.

7. A frequency synthesizing circuit according to in claim 6, wherein the monitoring circuit includes two groups of flip-flops, the first group of flip-flops receives a data bit flow signal indicating counter overflow or underflow as input, and the second group of flip-flops outputs a selection signal to said selecting means for selecting one of the three pulse width modulated control signals; and said first and second group of flip-flops in relation to the first pulse width modulated control signal operate asynchronously and synchronously, respectively.

8. A radio telephone having a frequency synthesizing circuit with a circuit input receiving a data bit flow and circuit output supplying a data modulated output signal and including a phase locked loop (PLL) having a forward path coupled to said circuit output and a feedback path coupled to said forward path, wherein:

said phase locked loop (PLL) comprises:

a voltage controlled oscillator in said forward path, having a first input on which a digital modulating signal is received, a second input from said feedback path on which a phase error signal is received, and an output to said forward path, for supplying said data modulated output signal to said circuit output and said feedback path, said data modulated output signal having a channel frequency determined by said digital modulating signal adjusted by said phase error signal; and prescaler divider means in said feedback path, having a prescaler period, for dividing the channel frequency of the data modulated output signal with a divisor and outputting a divided signal;

and further comprising means for compensating for the distribution of bits in said digital modulating signal comprising:

a stable clock signal generator for supplying a stable clock signal;

a phase detecting unit for comparing said divided signal divided by said prescaler divider means with said stable clock signal, and generating a phase error signal in response thereto;

a monitoring circuit for generating a compensation signal in dependence upon the distribution of bits in said digital modulating signal;

a control unit for outputting a first pulse width modulated control signal; and a compensation circuit, having controlling means, responsive to said first pulse width modulated control signal, for controlling said divisor by controlling the ratio between the number of prescaler periods having the divisor N and the number having the divisor (N+1), and respectively generating second and third pulse width modulated control signals having pulse widths corresponding to a slight decrease and slight increase of said divisor, and, selecting means for selecting and outputting, in response to said compensation signal, one of said first, second, and third pulse width modulated control signals to said prescaler divider means, whereby said divisor is controlled by said control unit in dependence upon said channel frequency and said monitoring unit to compensate for the distribution of bits in said digital modulating signal.

9. A radio telephone according to claim 8, wherein said controlling means of said compensation circuit comprises:

two branches carrying the first pulse width modulated control signal from the control unit;

delay means in one of said branches for providing a delayed version of the first pulse width modulated control signal;

an AND gate receiving the delayed and the non-delayed version of the first pulse width modulated control signal and providing said second pulse width modulated control signal with a reduced duty cycle compared with the first pulse width modulated control signal; and an OR gate receiving the delayed and the non-delayed version of the first pulse width modulated control signal and providing said third pulse width modulated control signal with an increased duty cycle compared with the first pulse width modulated control signal.

10. A radio telephone according to claim 9, wherein the delay means comprises a flip-flop controlled by a clock signal from said control unit and associated with the first pulse width modulated control signal.

11. A radio telephone according to claim 8, wherein the selecting means of said compensation circuit comprises a switch receiving the three pulse width modulated control signals, said switch comprising a control input for receiving said phase error signal and selecting one of said pulse width modulated control signals for passing through the compensation circuit.

12. A radio telephone according to claim 11, wherein the compensation circuit comprises a second flip-flop controlled by a clock signal from said control unit and associated with the first pulse width modulated control signal.

13. A radio telephone according to claim 8, wherein the monitoring circuit includes an up/down counter for receiving the data bit flow and producing a digital output, said counter increasing or decreasing the digital output in dependence on the data bit flow input thereto, and a D/A converter for receiving said digital counter output and providing a quantization error signal to the phase locked loop wherein said quantization error signal is added to the phase error signal from the phase detecting unit.

14. A radio telephone according to claim 13, wherein the monitoring circuit includes two groups of flip-flops, the first group of flip-flops receives a data bit flow signal indicating counter overflow or underflow as input, and the second group of flip-flops outputs a selection signal to said selecting means for selecting one of the three pulse width modulated control signals; and said first and second group of flip-flops in relation to the first pulse width modulated control signal operate asynchronously and synchronously, respectively.

15. A radio telephone according to claim 8, wherein said prescaler divider means comprises a prescaler unit for dividing the channel frequency of the data modulated output signal with a first divisor and outputting a first divided signal, and a divider unit for dividing said first divided signal by a second divisor.

* * * * *